(12) United States Patent
Shin et al.

(10) Patent No.: US 7,728,375 B2
(45) Date of Patent: Jun. 1, 2010

(54) SEMICONDUCTOR MEMORY DEVICE AND METHOD OF FORMING THE SAME

(75) Inventors: Kyoung-Sub Shin, Seongnam-si (KR); Cheol-Kyu Lee, Yongin-si (KR); Sung-il Cho, Seoul (KR); Young-Kyu Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/219,358

(22) Filed: Jul. 21, 2008

(65) Prior Publication Data

US 2009/0026515 A1    Jan. 29, 2009

(30) Foreign Application Priority Data

Jul. 23, 2007    (KR) ...................... 10-2007-0073611

(51) Int. Cl.
*H01L 27/108* (2006.01)
(52) U.S. Cl. ...................................... 257/306; 438/253
(58) Field of Classification Search ................. 257/296, 257/306; 438/253, 618
See application file for complete search history.

(56) References Cited

U.S. PATENT DOCUMENTS 7,511,327 B2 *   3/2009   Matsui et al. ............... 257/310

FOREIGN PATENT DOCUMENTS

| KR | 1020060004467 | 1/2006 |
|----|---------------|--------|
| KR | 1020070000719 | 1/2007 |
| KR | 100702028     | 3/2007 |

* cited by examiner

*Primary Examiner*—Mark Prenty
(74) *Attorney, Agent, or Firm*—Harness, Dickey & Pierce, P.L.C.

(57) ABSTRACT

Example embodiments relate to a semiconductor memory device and a method of forming the semiconductor memory device. The semiconductor memory device may include a first interlayer insulating layer on a semiconductor substrate. A bit line may be arranged in a first direction on the first interlayer insulating layer. A bit line contact pad may be disposed in the first interlayer insulating layer and electrically connected to the bit line. A storage contact pad may be disposed in the first interlayer insulating layer. A top surface of the bit line contact pad may be lower than a top surface of the storage contact pad.

19 Claims, 12 Drawing Sheets

SEMICONDUCTOR MEMORY DEVICE AND METHOD OF FORMING THE SAME

PRIORITY STATEMENT

This application claims priority under 35 U.S.C. §119 to Korean Patent Application No. 10-2007-0073611, filed on Jul. 23, 2007 with the Korean Intellectual Property Office (KIPO), the entire contents of which are incorporated herein by reference.

BACKGROUND

1. Technical Field

Example embodiments relate to semiconductor devices and methods of forming semiconductor devices.

2. Description of the Related Art

Dynamic random access memories (DRAM) consist of unit cells including one transistor and one capacitor. Reducing chip size is important when attempting to increase the integration of a DRAM device. Chip size reduction may be realized by a new cell structure. A $6.3F^2$ structure has been introduced as such a new cell structure.

In a $6.3F^2$ structure, a storage contact and a storage contact pad are not precisely aligned with each other. As a result, the center axis of the storage contact and the center axis of the storage contact pad are not located on the same straight line. However, having a sufficient contact area between the storage contact and the storage contact pad is important. Thus, a process of enlarging the contact hole that is filled with the storage contact may be used to increase the contact area.

A metal silicide layer may be disposed between a bit line contact and a bit line contact pad to reduce the resistance between the bit line and the bit line contact pad. However, in the process of enlarging the contact hole, the metal silicide layer may be melted by the etching solution. As a result of the melting of the metal silicide layer, voids may occur between the bit line and the bit line contact pad.

SUMMARY

Example embodiments relate to a semiconductor memory device. The semiconductor memory device may include a first interlayer insulating layer on a semiconductor substrate, a bit line arranged in a first direction on the first interlayer insulating layer, a bit line contact pad disposed in the first interlayer insulating layer and electrically connected to the bit line, and/or a storage contact pad disposed in the first interlayer insulating layer. A top surface of the bit line contact pad may be lower than a top surface of the storage contact pad.

Example embodiments also relate to a method of forming a semiconductor memory device. The method may include forming a first interlayer insulating layer on a semiconductor substrate, forming a bit line contact pad and a storage contact pad in the first interlayer insulating layer, forming a second interlayer insulating layer on the first interlayer insulating layer, forming a bit line contact in the second interlayer insulating layer so as to connect with the bit line contact pad, forming a bit line in a first direction on the second interlayer insulating layer; and/or forming a storage contact in the second interlayer insulating layer so as to connect with the storage contact pad. A top surface of the bit line contact pad may be lower than a top surface of the storage contact pad.

DETAILED DESCRIPTION OF EXAMPLE EMBODIMENTS

Figure 1:
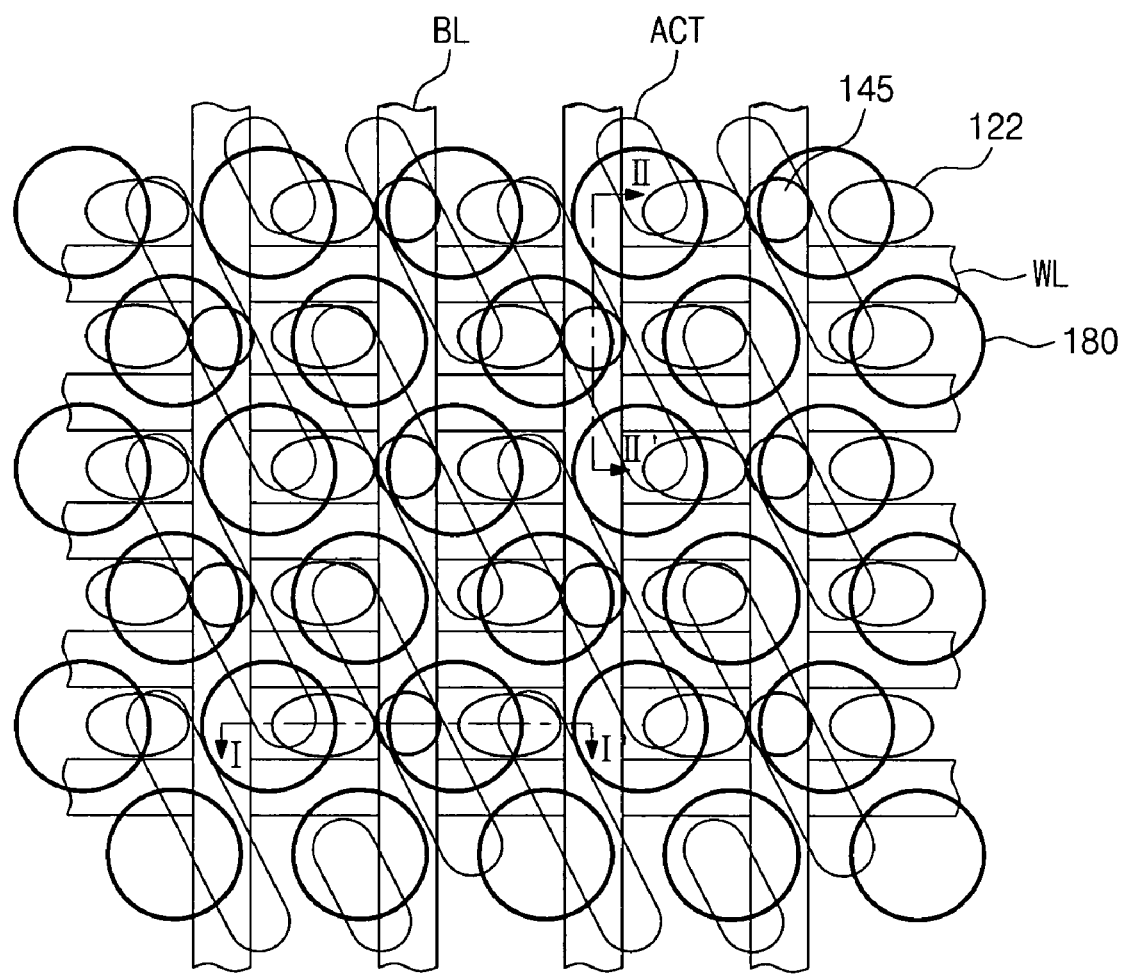
FIG. 1 is a top plan view of a cell array structure of a semiconductor memory device according to example embodiments.

Example embodiments are described in more detail below with reference to the accompanying drawings. However, the devices and corresponding methods may be embodied in many different forms and should not be construed as limited to the examples set forth herein.

It should be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It should be understood that although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the present application.

The terminology used herein is for the purpose of describing particular embodiments only and should not be construed to limit the scope of the present application. As used herein, the singular forms "a", "an", and "the" are intended to include the plural forms as well, unless the context clearly indicates otherwise. It should be further understood that the terms "comprises", "comprising", "includes", and "including" specify the presence of stated features, regions, integers, steps, operations, elements, and/or components, but do not preclude the presence or addition of one or more other features, regions, integers, steps, operations, elements, components, and/or groups thereof.

Example embodiments may be described with reference to cross-sectional illustrations, which may be schematic illustrations of idealized embodiments. As such, variations from the shapes of the illustrations (e.g., as a result of manufacturing techniques and/or tolerances) are to be expected. Thus, example embodiments should not be construed to be limited to the particular shapes of regions illustrated herein, but are to include deviations in shapes that result may from, e.g., manufacturing. For example, a region illustrated as a rectangle may have rounded or curved features. Thus, the regions illustrated in the figures are schematic in nature and are not intended to limit the scope of the present application.

Unless otherwise defined, all terms (including technical and scientific terms) used herein have the same meaning as commonly understood by one of ordinary skill in the art. It should be further understood that terms, such as those defined in commonly used dictionaries, should be interpreted as having a meaning that is consistent with their meaning in the context of the relevant art and/or the present application and should not be interpreted in an idealized or overly formal sense unless expressly so defined herein.

In the drawings, the thickness of layers and/or regions may have been exaggerated for clarity. It should also be understood that when an element such as a layer, region, and/or substrate is referred to as being "on" or "onto" another element, it may lie directly on the other element or intervening elements or layers may also be present. Like reference numerals refer to like elements throughout the specification.

Spatially relative terms, such as "beneath," "below," "above," "upper," "top," "bottom," and the like, may be used to describe an element and/or feature's relationship to another element(s) and/or feature(s). It should be understood that the spatially relative terms are intended to encompass different orientations of the device in use and/or operation in addition to the orientation depicted in the figures. For example, when the device in the figures is turned over, elements described as "below" and/or "beneath" other elements or features would then be oriented "above" the other elements or features. As used herein, "height" may refer to a distance that is generally orthogonal to the face of a substrate.

FIG. 1 is a top plan view of a cell array structure of a semiconductor memory device according to example embodiments. Referring to FIG. 1, a cell array of a 6.3F$^2$ cell structure may have a diagonal arrangement. Word lines WL may be arranged in a first direction. Bit lines BL may be arranged in a second direction so as to be perpendicular to the word lines WL. Active regions ACT may be arranged in a third direction so as to be diagonal to the word lines WL and the bit lines BL. A bit line contact 145 may be disposed at an intersection of the active region ACT and the bit line BL. A storage contact pad 122 may be disposed on both ends of the active region ACT. A capacitor having a cylindrical shape may be electrically connected to the storage contact pad 122.

The word lines WL and the bit lines BL may have a minimum line width (F). A distance between the center lines of the word lines WL may be about 2.1 times larger than the minimum line width (F). A distance between the center lines of the bit lines BL may be about three times larger than the minimum line width (F). Thus, a reduced cell size (as compared with a 8F$^2$ cell structure) may be realized.

Figure 2A:
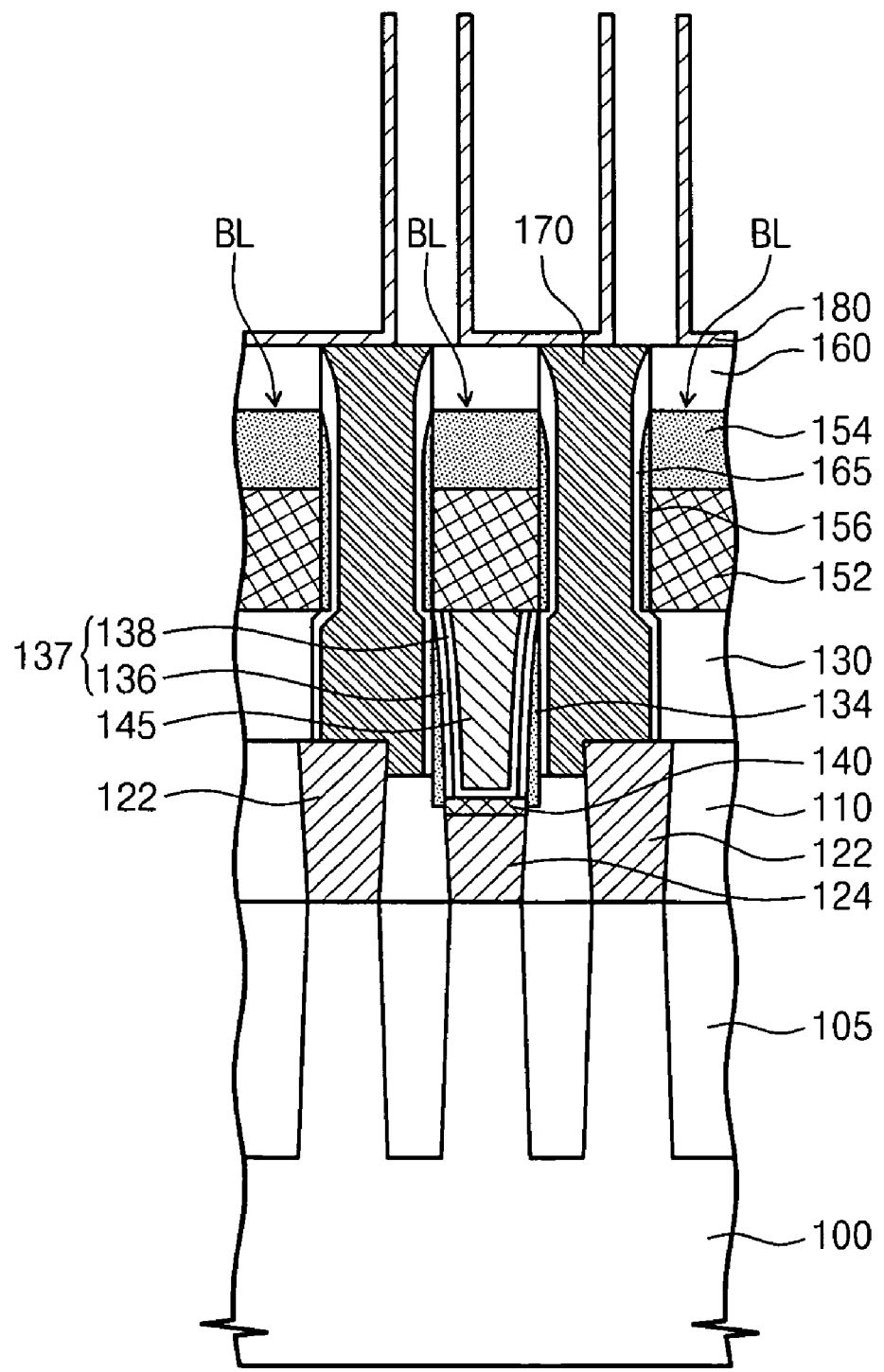
FIGS. 2A and 2B are cross-sectional views of the semiconductor memory device of FIG. 1.
Figure 2B:
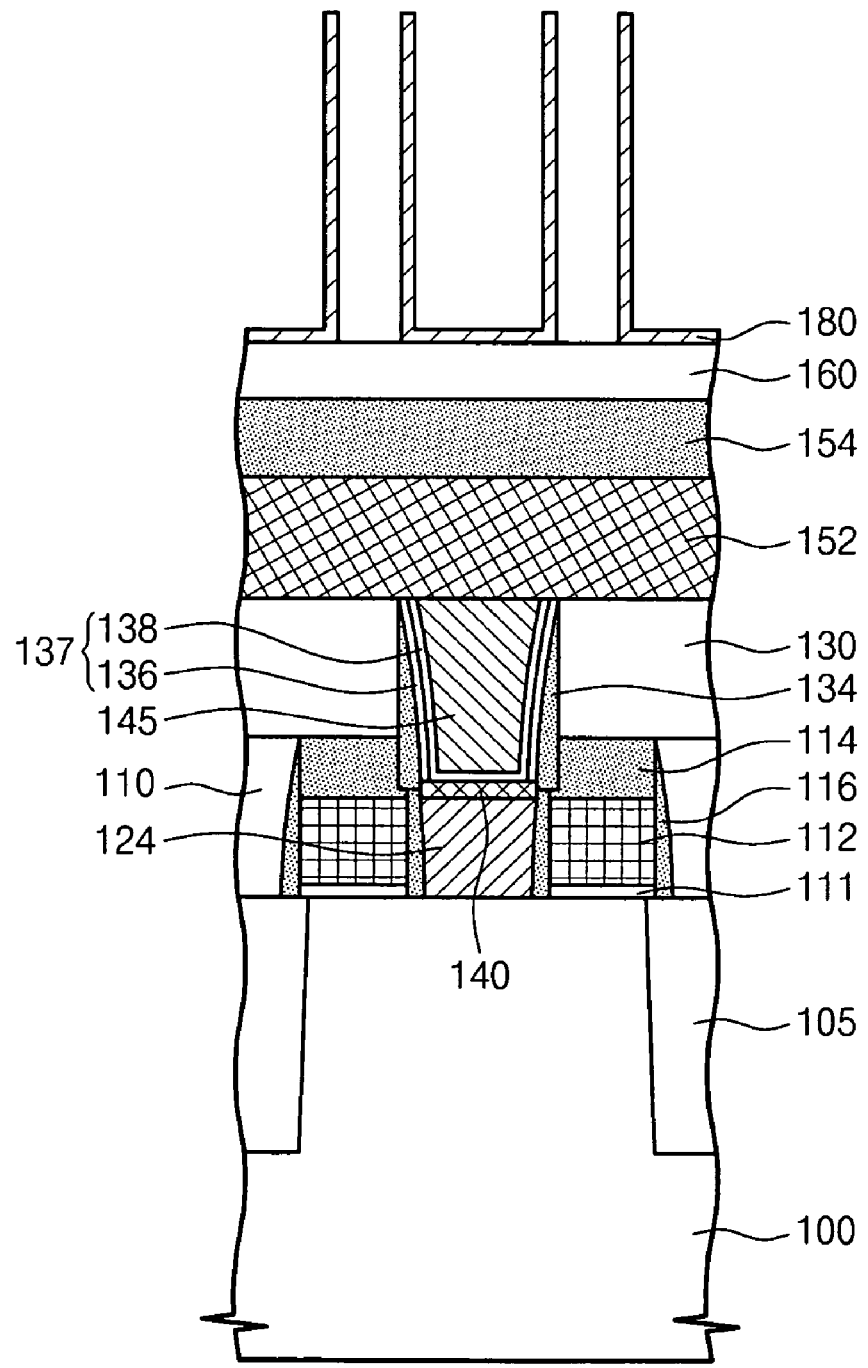

FIGS. 2A and 2B are cross-sectional views of the semiconductor memory device of FIG. 1. FIG. 2A is a cross-sectional view taken along line I-I' of FIG. 1. FIG. 2B is a cross-sectional view taken along line II-II' of FIG. 1.

Referring to FIGS. 1, 2A, and 2B, device isolation layers 105 may provided in a semiconductor substrate 100 to define the active regions ACT. A word line WL may be disposed on the semiconductor substrate 100. The word line WL may include a gate insulating layer 111, a first conductive pattern 112, a first mask pattern 114, and a first spacer 116. A first interlayer insulating layer 110 may be disposed between the word lines WL. A storage contact pad 122 and a bit line contact pad 124 may be disposed in the first interlayer insulating layer 110. The storage contact pad 122 and the bit line contact pad 124 may be aligned with the word line WL. A top surface of the bit line contact pad 124 may be lower than a top surface of the storage contact pad 122. The storage contact pad 122 and the bit line contact pad 124 may include polysilicon.

A second interlayer insulating layer 130 may be disposed on the first interlayer insulating layer 110. A bit line contact 145 may be disposed in the second interlayer insulating layer 130. The bit line contact 145 may be electrically connected to the bit line contact pad 124. The bit line contact 145 may include tungsten (W). A metal silicide layer 140 may be disposed between the bit line contact 145 and the bit line contact pad 124. The metal silicide layer 140 may connect the bit line contact 145 to the bit line contact pad 124. The metal silicide layer 140 may also reduce the resistance between the bit line contact 145 and the bit line contact pad 124. The metal silicide layer 140 may include titanium silicide. A barrier layer 137 may be disposed on a sidewall and a bottom surface of the bit line contact 145. The barrier layer 137 may include a metal layer 136 and a metal nitride layer 138. The metal layer 136 may be a titanium (Ti) layer, and the metal nitride layer 138 may be a titanium nitride layer.

A bit line BL may be connected to the bit line contact 145. The bit line BL may include a second conductive pattern 152, a second mask pattern 154, and a third spacer 156. The second conductive pattern 152 may include tungsten (W). The bit lines BL may be disposed so as to be perpendicular to the word lines WL. The active regions ACT may be disposed so as to be diagonal to the word lines WL and the bit lines BL.

A third interlayer insulating layer 160 may be disposed so as to cover the bit line BL. A storage contact 170 may be connected to the storage contact pad 122. The lowest bottom surface of the storage contact 170 may be higher than a top surface of the bit line contact pad 124. The storage contact 170 may contact a top surface and a side surface of the storage contact pad 122. Such contact may reduce the resistance between the storage contact 170 and the storage contact pad 122. Because the storage contact 170 may not be aligned exactly with the storage contact pad 122, the contact area between the storage contact 170 and the storage contact pad 122 may be increased by the top surface and side surface contact.

A second spacer 134 may be in contact with the barrier layer 137. The second spacer 134 may also be in contact with a first mask pattern 114 of the word line WL. The second spacer 134 may compensate for a portion of the first mask pattern 114 that may have been etched. A fourth spacer 165 may be disposed between the third spacer 156 and the storage contact 170. The third and fourth spacers 156 and 165 may reduce or prevent the occurrence of a short circuit between the bit line contact 145 and the storage contact 170. A storage electrode 180 may be disposed so as to contact the storage contact 170. The storage electrode 180 may not be aligned exactly with the storage contact 170.

A top surface of the bit line contact pad 124 may be lower than a top surface of the storage contact pad 122, thereby reducing or preventing the occurrence of a short circuit between the metal silicide layer 140 and the storage contact 170. It may also be beneficial for the contact area between the storage contact pad 122 and the storage contact 170 to be increased. Additionally, the second spacer 134 may help to compensate for the etched portion of the first mask pattern 114.

FIGS. 3A through 9B are cross-sectional views of a method of forming a semiconductor memory device according to example embodiments. FIGS. 3A, 4A, 5A, 6A, 7A, 8, and 9A are cross-sectional views taken along the line I-I' of FIG. 1. FIGS. 3B, 4B, 5B, 6B, 7B, and 9B are cross-sectional views taken along the line II-II' of FIG. 1.

Figure 3A:
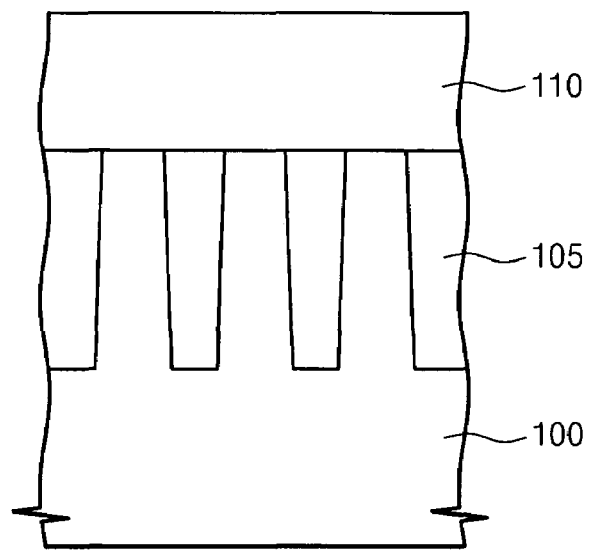
FIGS. 3A through 9B are cross-sectional views of a method of forming a semiconductor memory device according to example embodiments.
Figure 3B:
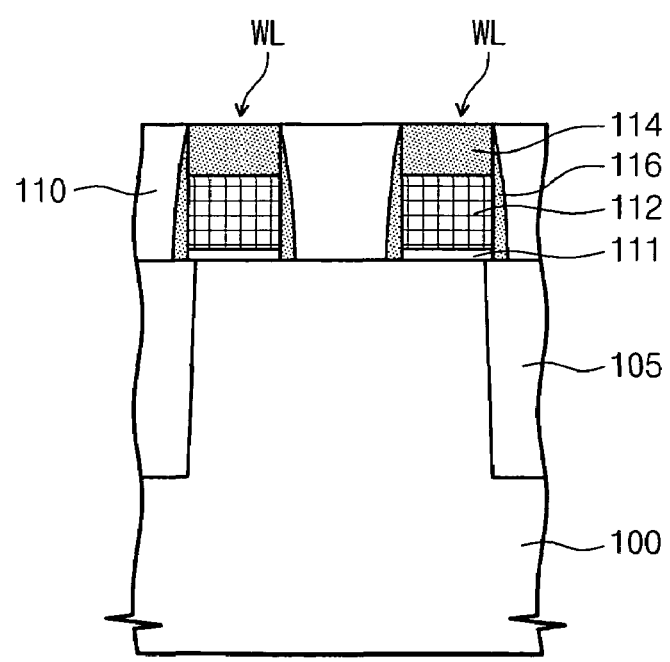

Referring to FIGS. 3A and 3B, device isolation layers 105 may be provided in a semiconductor substrate 100 to define active regions. The device isolation layers 105 may be formed using a shallow trench isolation method. Word lines WL may be formed in a first direction on the semiconductor substrate 100. The word lines WL may include a gate insulating layer 111, a first conductive pattern 112, a first mask pattern 114, and a first spacer 116. A first interlayer insulating layer 110 may be formed between the word lines WL. The first interlayer insulating layer 110 may expose top surfaces of the word lines WL.

Figure 4A:
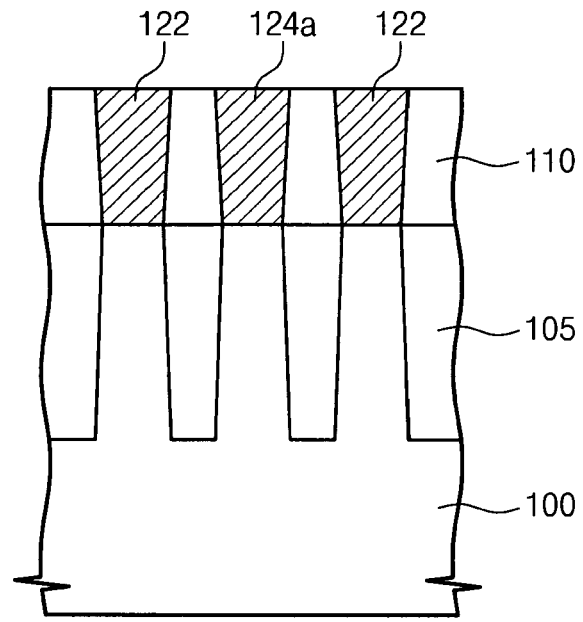
Figure 4B:
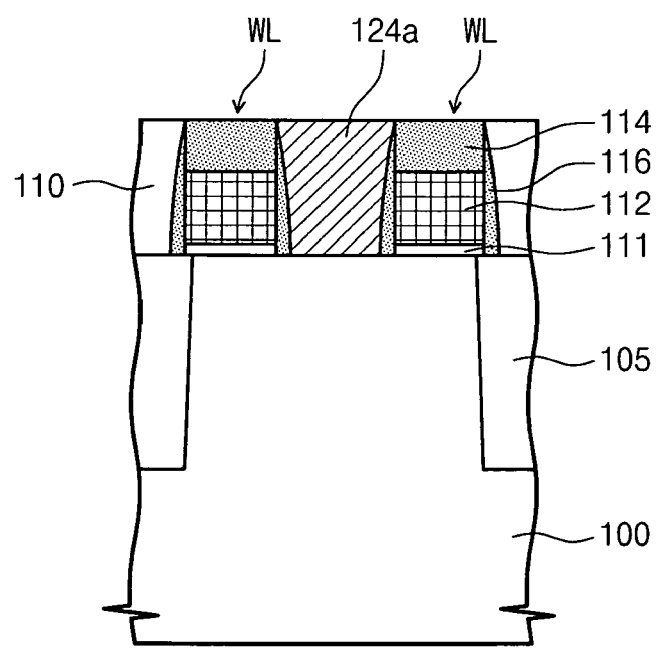

Referring to FIGS. 4A and 4B, storage contact pads 122 and a preliminary bit line contact pad 124a may be formed in the first interlayer insulating layer 110. The storage contact pads 122 and the preliminary bit line contact pad 124a may be simultaneously formed while also being aligned with the word lines WL. The storage contact pads 122 and the preliminary bit line contact pad 124a may be formed of polysilicon.

Figure 5A:
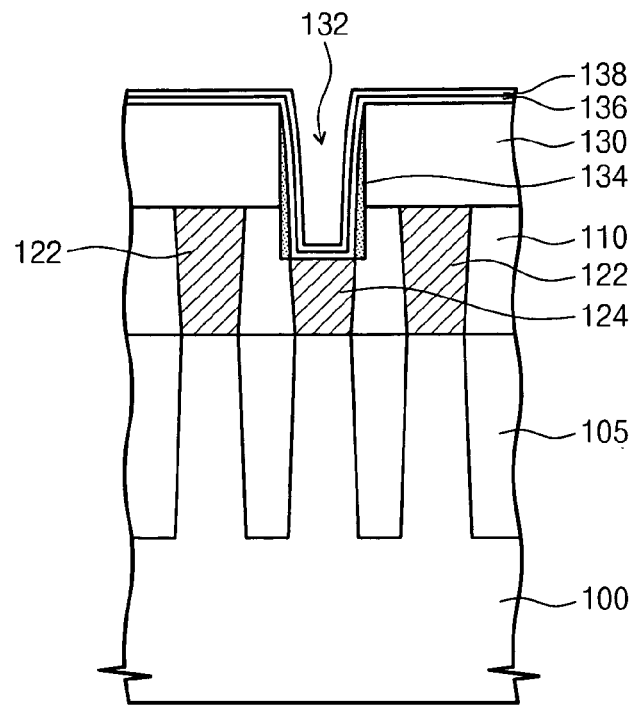
Figure 5B:
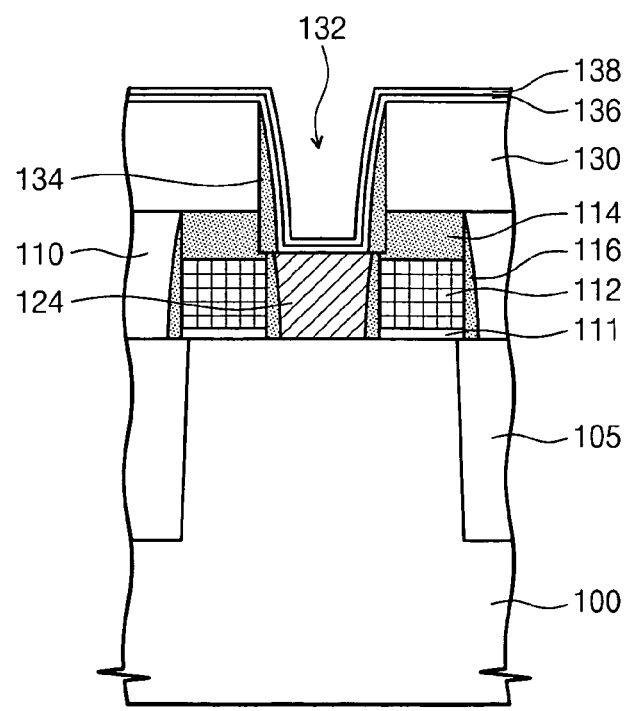

Referring to FIGS. 5A and 5B, the preliminary bit line contact pad 124a may be selectively recessed to form a bit line contact pad 124. As a result of the recession, the top surface of the bit line contact pad 124 may be lower than the top surfaces of the storage contact pads 122. A second interlayer insulating layer 130 may be formed on the first interlayer insulating layer 110. A first contact hole 132 may be formed in the second interlayer insulating layer 130 to expose the bit line contact pad 124. The width of the first contact hole 132 may be large enough to expose the entire top surface of the bit line contact pad 124.

The bit line contact pad 124 may be formed by performing an etching process on the preliminary bit line contact pad 124a using a photoresist pattern as an etch mask. Alternatively, the bit line contact pad 124 may be formed by performing an etching process using the second interlayer insulating layer 130 as an etch mask after forming the first contact hole 132.

A second spacer 134 may be formed on a sidewall of the first contact hole 132. The second spacer 134 may be formed of a silicon nitride layer or an oxynitride layer. The second spacer 134 may ameliorate or cure damage that may have occurred to the first mask pattern 114 of the word line WL during the process of forming the first contact hole 132. The second spacer 134 may also ameliorate or cure damage that may have occurred to the sidewalls of the first and second interlayer insulating layers 110 and 130 during the process of forming the first contact hole 132.

A thermostable metal layer 136 and a metal nitride layer 138 may be formed in the first contact hole 132 having the second spacer 134. The thermostable metal layer 136 may be formed to contact the bit line contact pad 124. The thermostable metal layer 136 may be formed of a titanium (Ti) layer, and the metal nitride layer 138 may be formed of a titanium nitride layer.

Figure 6A:
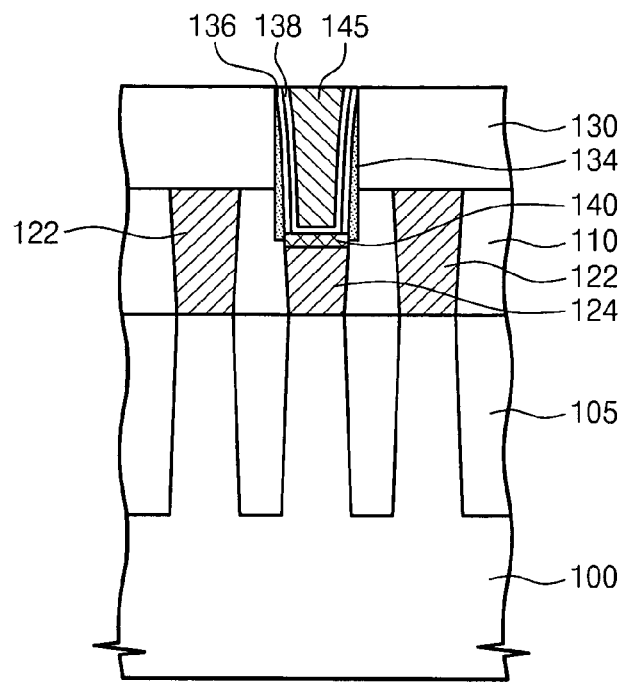
Figure 6B:
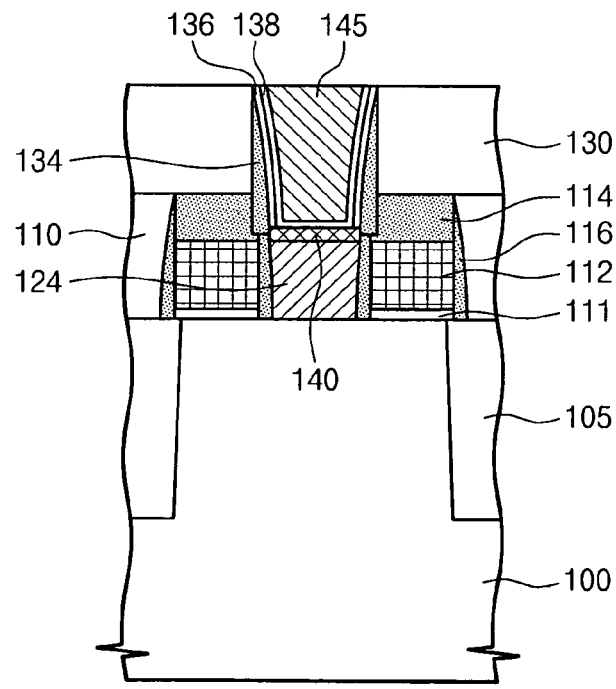

Referring to FIGS. 6A and 6B, a bit line contact 145 may be formed so as to fill the first contact hole 132. The bit line contact 145 may be formed of tungsten (W). The metal nitride layer 138 and the thermostable metal layer 136 may be planarized to expose the top surface of the second interlayer insulating layer 130. As a result, the top surface of the bit line contact 145 may be level with the top surface of the second interlayer insulating layer 130.

The thermostable metal layer 136 and the bit line contact pad 124 may be reacted with each other to form a metal silicide layer 140. The metal silicide layer 140 may be formed by performing an annealing process. The annealing process may be performed before or after the formation of the bit line contact 145. The metal silicide layer 140 may be a titanium silicide layer. The metal silicide layer 140 may reduce the resistance between the bit line contact pad 124 and the bit line contact 145.

Figure 7A:
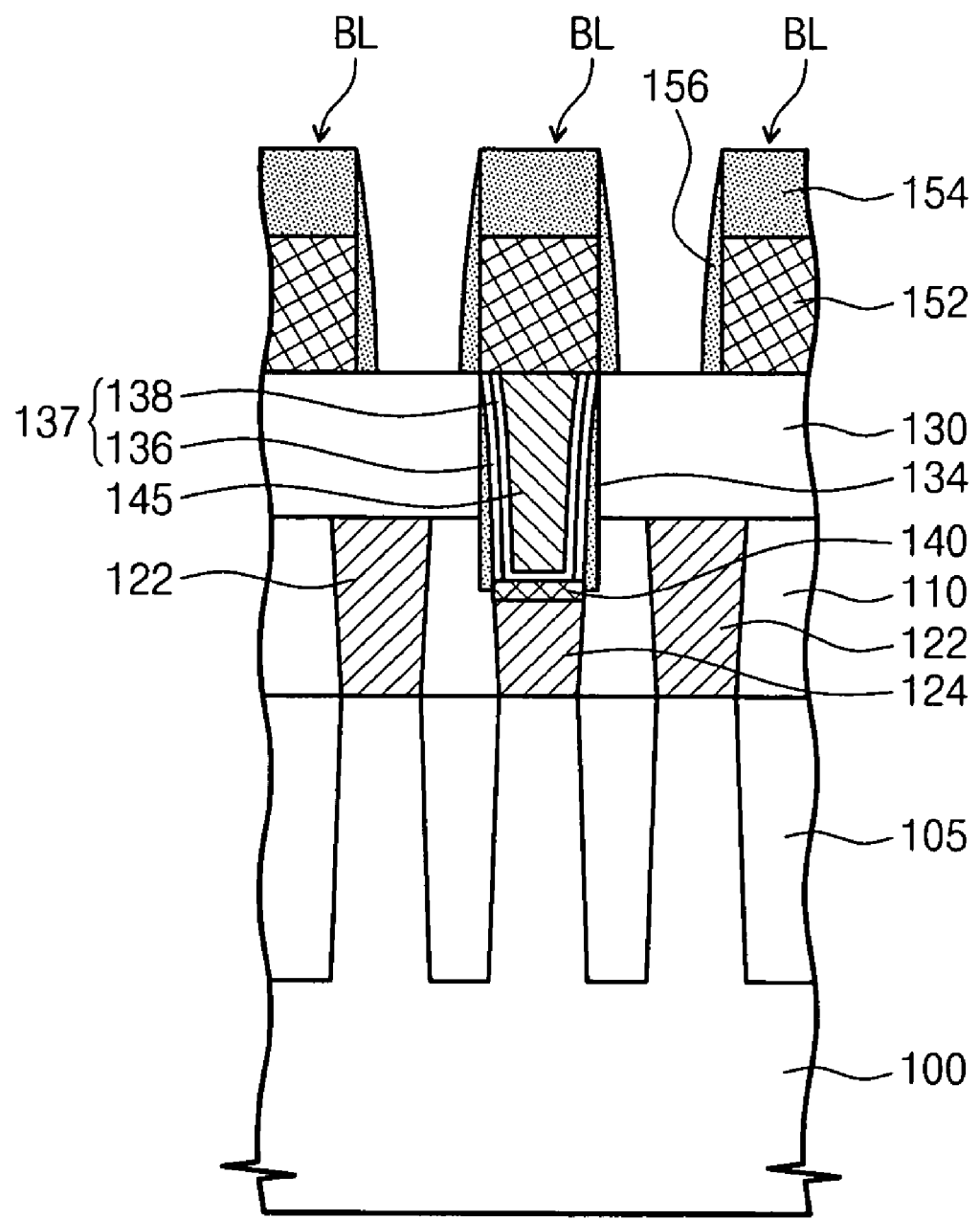
Figure 7B:
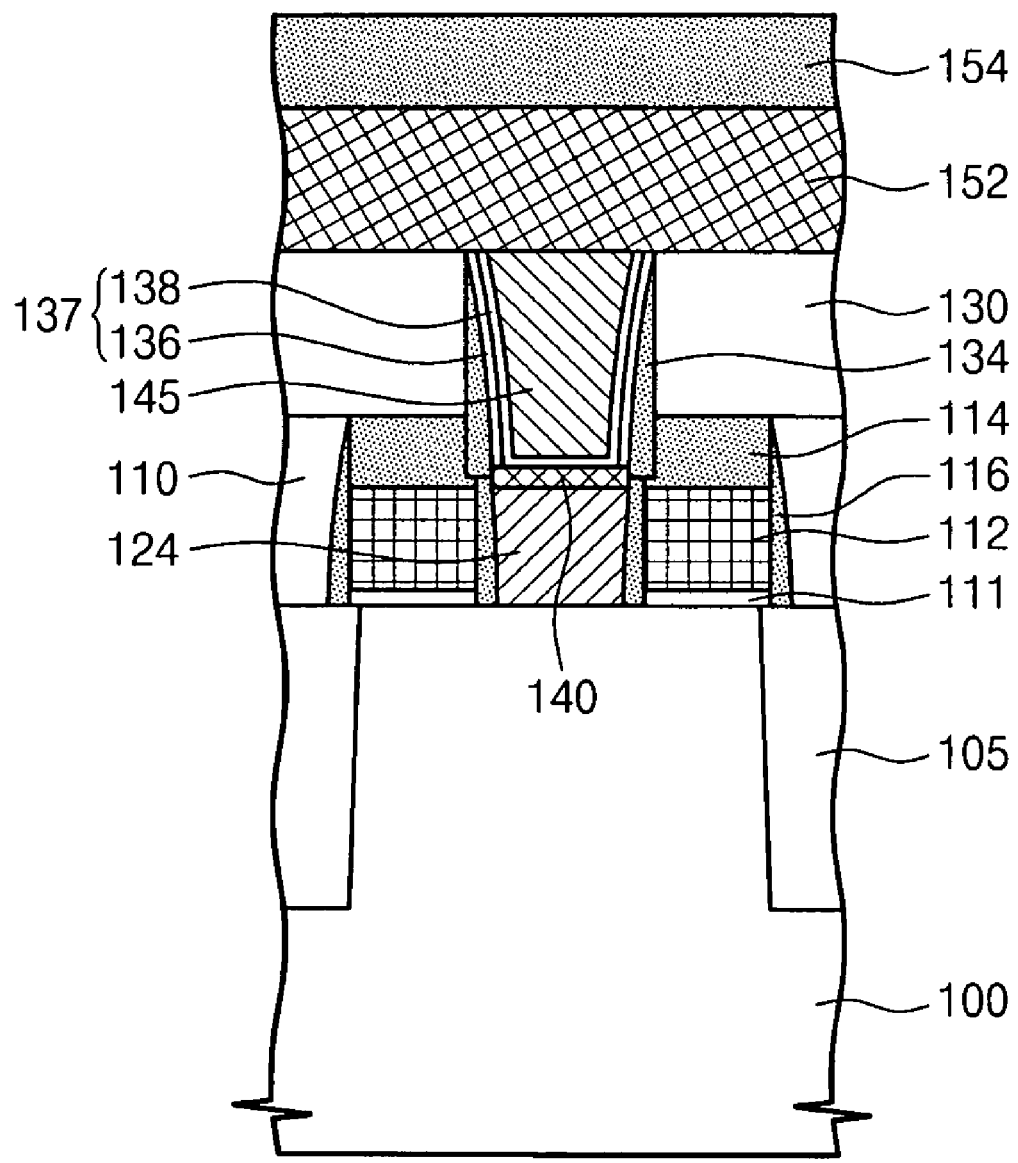

Referring to FIGS. 7A and 7B, bit lines BL may be formed on the second interlayer insulating layer 130. The bit lines BL may include a second conductive pattern 152, a second mask pattern 154, and a third spacer 156. The second mask pattern 154 and the third spacer 156 may be formed of a silicon nitride layer or a silicon oxynitride layer. The bit lines BL may be electrically connected to the bit line contact 145. The second conductive pattern 152 may be formed of tungsten (W).

Figure 8:
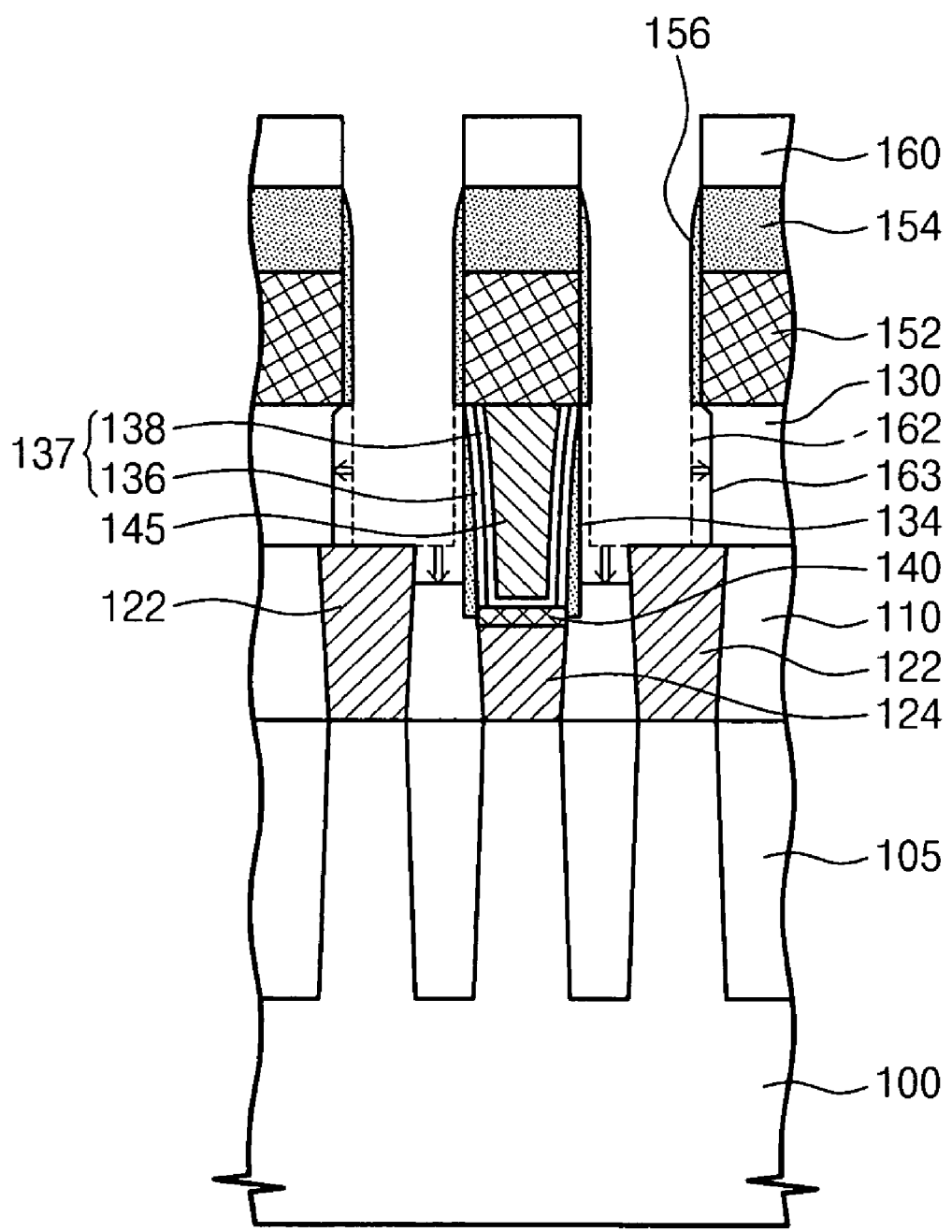

Referring to FIG. 8, a third interlayer insulating layer 160 may be formed on the bit lines BL. Second preliminary contact holes 162 may be formed through the third and second interlayer insulating layers 160 and 130 to expose the storage contact pads 122. Second contact holes 163 may be formed by performing an etching process to widen lower portions of the second preliminary contact holes 162. An etching solution used in the etching process may include hydrofluoric acid (HF). The third and second spacers 156 and 134 may have an etch selectivity with respect to the first and second interlayer insulating layers 110 and 130, respectively. Fourth spacers 165 may be formed on sidewalls of the second contact holes 163. The fourth spacers 165 may ameliorate or cure damage to the first, second, and third interlayer insulating layers 110, 130, and 160 that may have occurred during the process of forming the second contact hole 163.

Figure 9A:
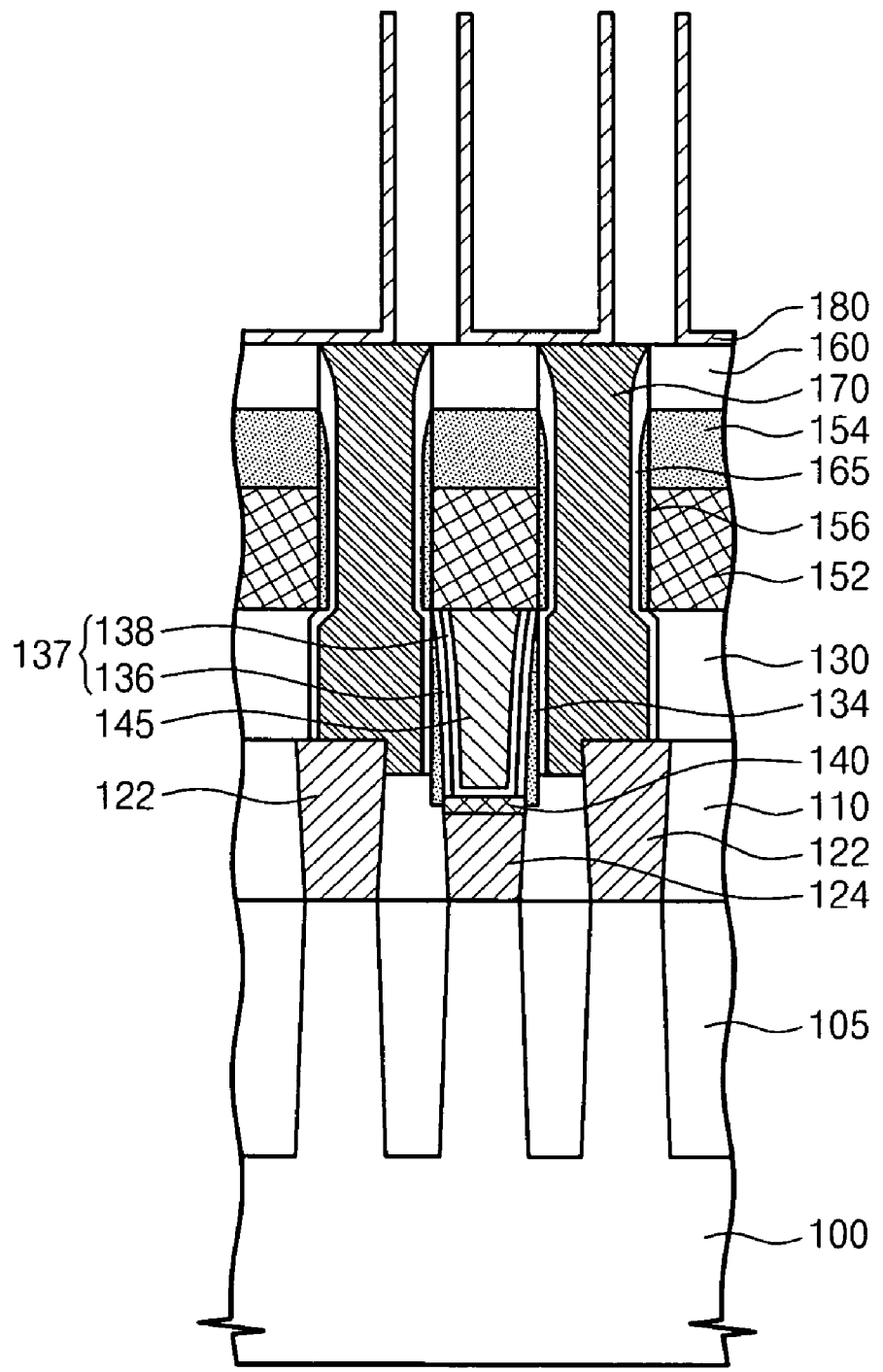
Figure 9B:
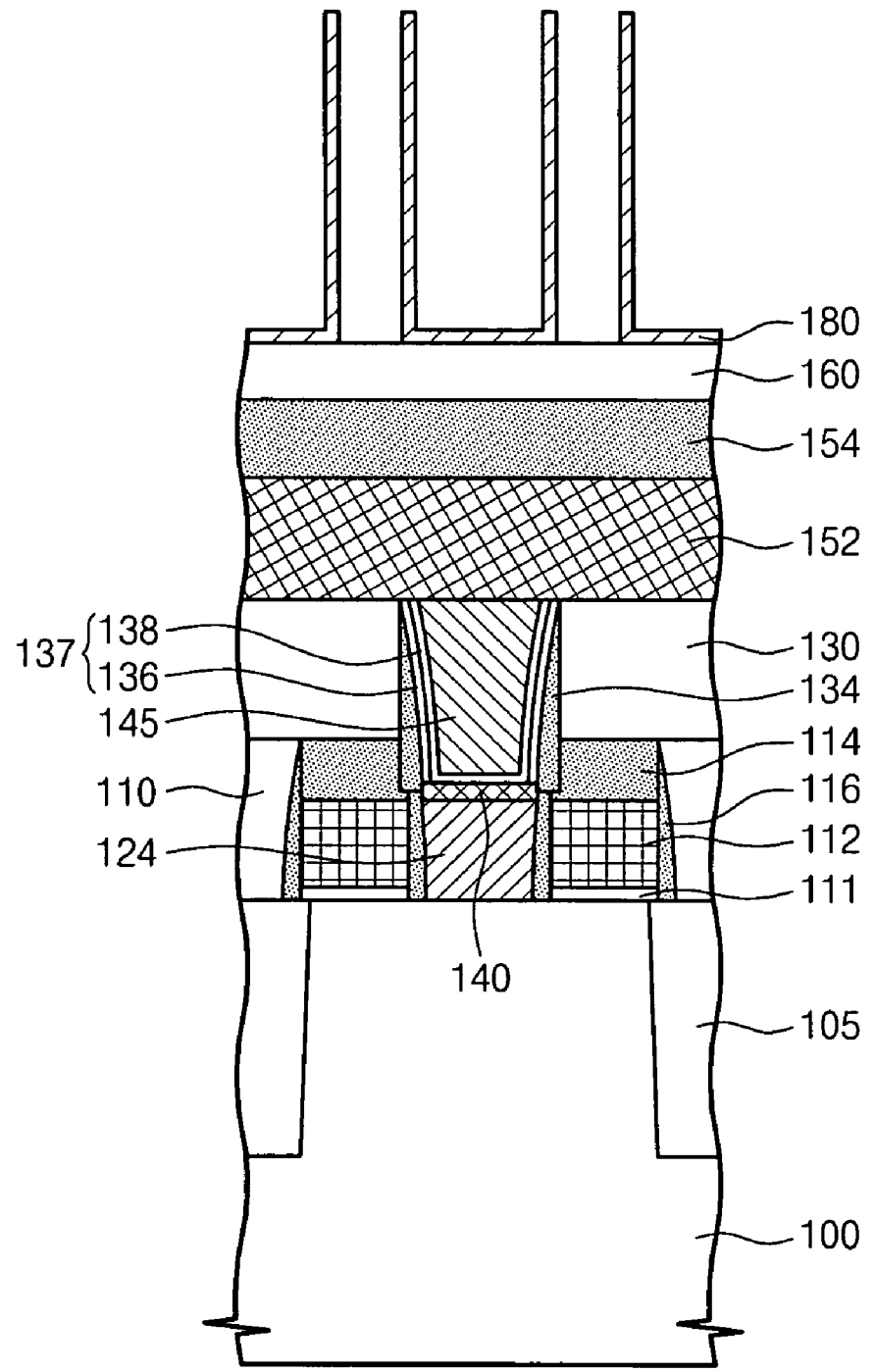

Referring to FIGS. 9A and 9B, storage contacts 170 may be formed in the second contact holes 163 so as to contact the storage contact pads 122. The top surface of the bit line contact pad 124 may be lower than the top surfaces of the storage contact pads 122. As a result, damage to the metal silicide layer 140 from the etching solution used to form the second contact holes 163 may be reduced or prevented. The contact area between the storage contact pads 122 and the storage contacts 170 may be increased by the above etching process, thereby reducing resistance. A storage electrode 180 may be formed so as to be connected to the storage contacts 170. The storage electrode 180 may not be aligned exactly with the storage contacts 170 because of the cell structure.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor memory device, comprising:
   a first interlayer insulating layer on a semiconductor substrate;
   a bit line arranged in a first direction on the first interlayer insulating layer:
   a bit line contact pad disposed in the first interlayer insulating layer and electrically connected to the bit line;
   a storage contact pad disposed in the first interlayer insulating layer, a top surface of the bit line contact pad being lower than a top surface of the storage contact pad; and
   a storage contact contacting the storage contact pad, wherein a lowest bottom surface of the storage contact is higher than the top surface of the bit line contact pad.

2. The device of claim 1, wherein the storage contact contacts the top surface and a side surface of the storage contact pad.

3. The device of claim 1, further comprising:
   a bit line contact disposed between the bit line contact pad and the bit line to connect the bit line contact pad to the bit line; and
   a metal silicide layer disposed between the bit line contact and the bit line contact pad to connect the bit line contact to the bit line contact pad.

4. The device of claim 3, further comprising:
a first spacer disposed between a side surface of the bit line contact and a side surface of the storage contact.

5. The device of claim 4, further comprising:
a second spacer disposed between the storage contact and the first spacer.

6. The device of claim 4, further comprising:
a word line arranged in a second direction so as to be perpendicular to the bit line; and
an active region disposed in the semiconductor substrate, the active region arranged in a third direction so as to be diagonal to the word line and the bit line.

7. The device of claim 6, wherein the word line includes a mask pattern on a conductive pattern, wherein the top surface of the bit line contact pad is lower than a top surface of the mask pattern.

8. The device of claim 7, wherein the first spacer contacts the mask pattern.

9. A method of forming a semiconductor memory device, comprising:
forming a first interlayer insulating layer on a semiconductor substrate;
forming a bit line contact pad and a storage contact pad in the first interlayer insulating layer;
forming a second interlayer insulating layer on the first interlayer insulating layer;
forming a bit line contact in the second interlayer insulating layer so as to connect with the bit line contact pad;
forming a bit line in a first direction on the second interlayer insulating layer; and
forming a storage contact in the second interlayer insulating layer so as to connect with the storage contact pad, a top surface of the bit line contact pad being lower than a top surface of the storage contact pad.

10. The method of claim 9, wherein forming the bit line contact pad includes:
simultaneously forming a preliminary bit line contact pad and the storage contact pad in the first interlayer insulating layer; and
selectively recessing the preliminary bit line contact pad.

11. The method of claim 9, wherein a lowest bottom surface of the storage contact is be higher than the top surface of the bit line contact pad.

12. The method of claim 9, wherein the storage contact contacts the top surface and a side surface of the storage contact pad.

13. The method of claim 9, wherein forming the bit line contact includes:
forming a first contact hole in the second interlayer insulating layer to expose the bit line contact pad;
forming a barrier layer including a thermostable metal layer in the first contact hole; and
reacting the thermostable metal layer with the bit line contact pad to form a metal suicide layer.

14. The method of claim 13, further comprising:
forming a first spacer on a sidewall of the first contact hole before forming the barrier layer.

15. The method of claim 14, further comprising:
forming a word line in a second direction in the first interlayer insulating layer so as to be perpendicular to the bit line; and
forming an active region in a third direction in the semiconductor substrate so as to be diagonal to the word line and the bit line.

16. The method of claim 15, wherein the top surface of the bit line contact pad is lower than a top surface of the word line.

17. The method of claim 15, wherein:
forming the word line includes forming a mask pattern on a conductive pattern;
forming the first contact hole includes etching a portion of the mask pattern; and
forming the first spacer includes disposing the first spacer on the etched portion of the mask pattern.

18. The method of claim 9, wherein forming the storage contact includes:
forming a second preliminary contact hole in the second interlayer insulating layer to expose the storage contact pad; and
performing an etching process to increase a width of the second preliminary contact hole to form a second contact hole.

19. The method of claim 18, further comprising:
forming a second spacer on a sidewall of the second contact hole.

* * * * *